United States Patent
Foley

(10) Patent No.: US 12,191,862 B2
(45) Date of Patent: Jan. 7, 2025

(54) HYBRID PHASE-INTERPOLATOR

(71) Applicant: MACOM Technology Solutions Holdings, Inc., Lowell, MA (US)

(72) Inventor: David Foley, Sophia Antipolis (FR)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 0 days.

(21) Appl. No.: 17/561,859

(22) Filed: Dec. 24, 2021

(65) Prior Publication Data
US 2023/0208411 A1    Jun. 29, 2023

(51) Int. Cl.
*H03K 5/131* (2014.01)
*H03K 5/00* (2006.01)
*H03M 1/66* (2006.01)

(52) U.S. Cl.
CPC ............ *H03K 5/131* (2013.01); *H03M 1/661* (2013.01); *H03K 2005/00026* (2013.01); *H03K 2005/00202* (2013.01)

(58) Field of Classification Search
CPC ......... H03K 5/131; H03K 2005/00026; H03K 2005/00202; H03M 1/661
See application file for complete search history.

(56) References Cited

U.S. PATENT DOCUMENTS

| | | | |
|---|---|---|---|
| 4,719,643 A | 1/1988 | Beeman | |
| 4,849,998 A | 7/1989 | Poklemba | |
| 4,912,730 A | 3/1990 | Erhart | |
| 4,947,425 A | 8/1990 | Grizmala et al. | |
| 5,194,828 A | 3/1993 | Kato et al. | |
| 5,210,712 A | 5/1993 | Saito | |

(Continued)

FOREIGN PATENT DOCUMENTS

| | | | | |
|---|---|---|---|---|
| CN | 109217850 A | * | 1/2019 | ............. H03K 5/135 |
| CN | 107689792 B | * | 4/2020 | ............... H03K 5/13 |

(Continued)

OTHER PUBLICATIONS

Analog & Power, "An Introduction to clock distribution circuits", Alexander Pakosta, Texas Instruments, 2 pages, date unknown.

(Continued)

*Primary Examiner* — Lincoln D Donovan
*Assistant Examiner* — James G Yeaman
(74) *Attorney, Agent, or Firm* — Weide & Miller, Ltd.

(57) ABSTRACT

A phase interpolator with a DAC outputting a first and second value responsive to a control code. A first current mirror generates a first current proportional to the first value. A second current mirror generates a second current proportional to the second value. A first FET pair comprising a first and second FET such that the source terminals of the first FET and the second FET are electrically connected and connect to the first current mirror. A second FET pair comprising a third and fourth FET such that the source terminals of the third FET and the fourth FET are electrically connected and connect to the second current mirror. A first terminal outputs a phase adjusted clock signal as compared to the clock signal, from the first FET and the third FET. A second terminal outputs an inverted phase adjusted clock signal, from the second FET and the fourth FET.

20 Claims, 6 Drawing Sheets

(56) References Cited

U.S. PATENT DOCUMENTS

| | | |
|---|---|---|
| RE34,972 E | 6/1995 | Horiguchi et al. |
| 5,570,217 A | 10/1996 | Fleuren |
| 5,621,518 A | 4/1997 | Beller |
| 5,642,387 A | 6/1997 | Fukasawa |
| RE35,607 E | 9/1997 | Nagamune et al. |
| 5,691,527 A | 11/1997 | Hara et al. |
| 5,699,402 A | 12/1997 | Bauer et al. |
| 5,884,231 A | 3/1999 | Perdue et al. |
| 5,886,552 A | 3/1999 | Chai et al. |
| 5,960,042 A | 9/1999 | Chang et al. |
| 5,963,901 A | 10/1999 | Vahatalo et al. |
| 5,968,180 A | 10/1999 | Baco |
| 6,028,661 A | 2/2000 | Minami et al. |
| 6,041,089 A | 3/2000 | Yokomizo |
| 6,064,707 A | 5/2000 | Woodman, Jr. |
| 6,075,628 A | 6/2000 | Fisher et al. |
| 6,108,794 A | 8/2000 | Erckson |
| 6,111,712 A | 8/2000 | Vishakhadatta et al. |
| 6,137,851 A | 10/2000 | Erickson et al. |
| 6,232,812 B1 | 5/2001 | Lee |
| 6,239,629 B1 | 5/2001 | Erickson |
| 6,269,136 B1 | 7/2001 | Hansen et al. |
| 6,317,062 B1 | 11/2001 | Payer et al. |
| 6,341,360 B1 | 1/2002 | Abdelilah et al. |
| 6,429,693 B1 | 8/2002 | Staszewski et al. |
| 6,441,659 B1 | 8/2002 | Demone |
| 6,445,662 B1 | 9/2002 | Tonami |
| 6,489,817 B1 | 12/2002 | Wong et al. |
| 6,512,610 B1 | 1/2003 | Minami et al. |
| 6,534,997 B1 | 3/2003 | Horishita et al. |
| 6,542,228 B1 | 4/2003 | Hartog |
| 6,547,453 B1 | 4/2003 | Stummer et al. |
| 6,756,828 B2 | 6/2004 | Lee et al. |
| 6,774,721 B1 * | 8/2004 | Popescu ................ H03K 5/003 |
| | | 330/253 |
| 6,873,279 B2 | 3/2005 | Jones et al. |
| 6,885,954 B2 | 4/2005 | Jones et al. |
| 7,423,469 B2 * | 9/2008 | Pickering ................ H03K 5/13 |
| | | 327/256 |
| 7,425,856 B2 | 9/2008 | Abel et al. |
| 7,474,720 B2 | 1/2009 | Yuuki et al. |
| 7,583,117 B2 | 9/2009 | Lin |
| 7,656,984 B2 | 2/2010 | Kim et al. |
| 7,684,531 B2 | 3/2010 | Masui et al. |
| 7,978,012 B2 | 7/2011 | Woodman, Jr. |
| 8,004,328 B2 * | 8/2011 | Kim ..................... H03L 7/07 |
| | | 327/158 |
| 8,134,393 B1 | 3/2012 | Nagaraj |
| 8,274,320 B2 * | 9/2012 | Hsu .................... H03F 3/45636 |
| | | 327/356 |
| 8,548,110 B2 | 10/2013 | Lin et al. |
| 8,664,993 B2 | 3/2014 | Gu |
| 8,958,512 B1 | 2/2015 | Ding |
| 9,577,622 B2 | 2/2017 | Da Dalt et al. |
| 9,876,489 B1 | 1/2018 | Casey et al. |
| 10,333,533 B1 | 6/2019 | Moscone |
| 11,159,151 B1 * | 10/2021 | Lu ........................ H04L 7/0025 |
| 2001/0043172 A1 | 11/2001 | McGrath et al. |
| 2002/0114383 A1 | 8/2002 | Belge et al. |
| 2005/0186918 A1 | 8/2005 | Ramet et al. |
| 2006/0001494 A1 | 1/2006 | Garlepp et al. |
| 2008/0111597 A1 | 5/2008 | Cranford et al. |
| 2008/0265998 A1 | 10/2008 | Woodman, Jr. |
| 2008/0290953 A1 | 11/2008 | Sandner et al. |
| 2009/0141774 A1 | 6/2009 | Araki et al. |
| 2009/0189656 A1 | 7/2009 | Huang |
| 2009/0244375 A1 | 10/2009 | Moehlmann et al. |
| 2010/0027611 A1 | 2/2010 | Dai |
| 2010/0074037 A1 | 3/2010 | Lin |
| 2011/0032013 A1 | 2/2011 | Nelson et al. |
| 2012/0038400 A1 | 2/2012 | Talaga, Jr. |
| 2012/0139595 A1 | 6/2012 | Kamath |
| 2013/0271193 A1 | 10/2013 | Keith |
| 2018/0262373 A1 | 9/2018 | Shibasaki |
| 2018/0323748 A1 * | 11/2018 | Motoroiu ............ H03F 3/45672 |

FOREIGN PATENT DOCUMENTS

| | | |
|---|---|---|
| CN | 112202426 | 1/2024 |
| KR | 100738236 B1 * | 7/2007 |

OTHER PUBLICATIONS

Texas Instruments, Application Report, "Using the CDCL6010 as a Frequency Synthesizer and Jitter Cleaner", Madhu Balasubramanian, SLLA259—Mar. 2007, Copyright © 2007, Texas Instruments Incorporated, 15 pages.

CDC7005, "3.3-V High Performance Clock Synthesizer and Jitter Cleaner", SCAS685J-December 2002-Revised Jul. 2008, Copyright @ 2008, Texas Instruments Incorporated, 33 pgs.

* cited by examiner

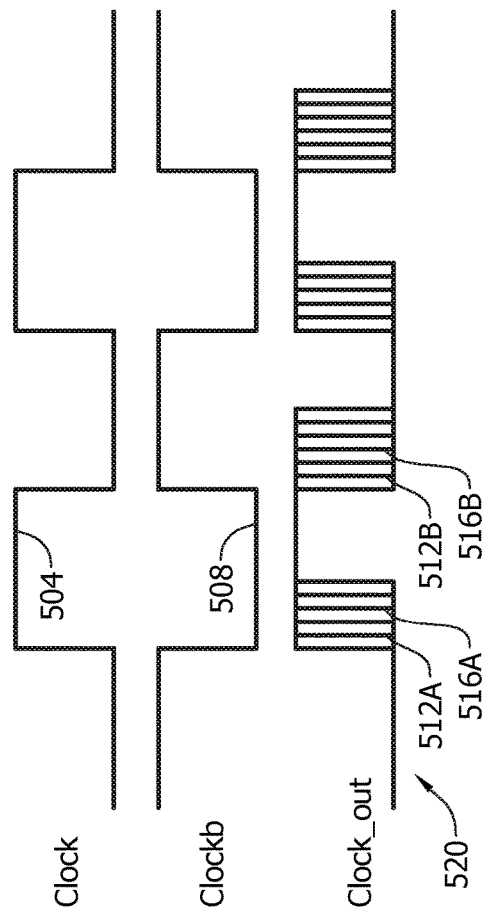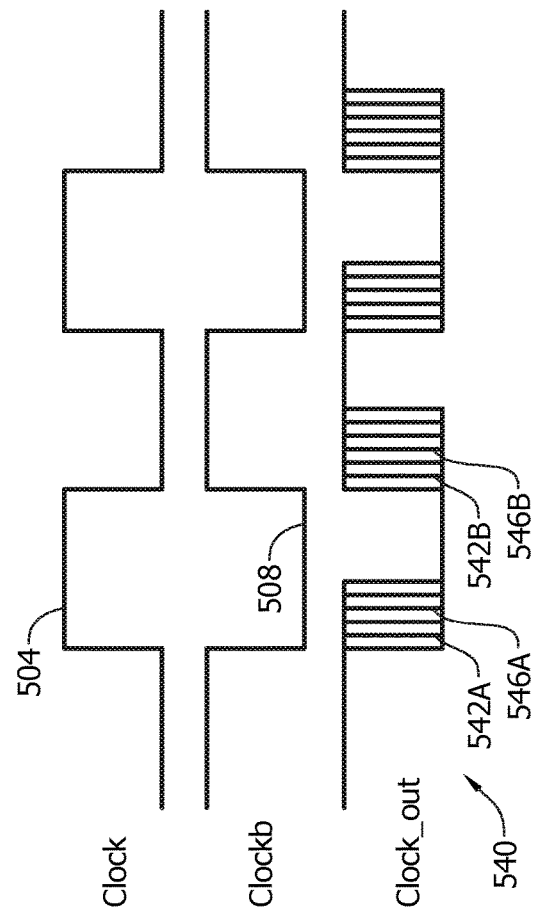

HYBRID PHASE-INTERPOLATOR

FIELD OF THE INVENTION

The invention relates to phase interpolators and in particular to a method and apparatus for adjusting clock phase without a quadrature clock input.

RELATED ART

Phase-interpolators (PI) are a common device to establish a clock delay adjustment in a signal. Prior art phase interpolators require differential quadrature phased clocks (which are phase separated by 90°) to function. However, as a drawback to the prior art, these differential quadrature clocks may not always be available in the design, and to create differential quadrature clocks requires additional complexity and power consumption. FIG. 1 illustrates exemplary quadrature clock plots. As shown in FIG. 1, the quadrature clocks may be represented by a I clock signal 212 and a Q clock signal 216 which are offset in phase by 90 degrees. The other two signals which form the quadrature clocks are inverted or differential versions of I clock signal 212 and a Q clock signal 216 which form Ib clock signal 220 and Qb clock signal 224. The Ib clock 220 is an inverted version of I clock signal 212 and the Qb clock signal 224 is an inverted version of the Q clock signal 216.

Other prior art approaches for delaying or phase adjusting a signal involve delaying a clock signal using LC delays or variable capacitors loaded on buffer stages. However, this approach suffers from several drawbacks. One such drawback is that the resulting clock adjustment is quite coarse, and thus inaccurate. This would not permit the fine resolution delay that is available from traditional PIs. In addition, the coarse delays vary significantly over process, voltage, and temperature (PVT).

Another prior art approach is stage blending which uses an analog phase mixer to blend or mix two clock phases. However, prior art phase blending requires significant power to achieve fine resolution delay, and thus is not suitable in numerous applications.

SUMMARY

This new hybrid PI achieves the fine delay resolution and maintains the tight variation over process, voltage, and temperature changes that one would expect from a traditional PI while providing additional benefits as are discussed below. To overcome the drawbacks of the prior art and provide additional advantages, a phase interpolator is disclosed. In one embodiment the phase interpolator comprises digital to analog converter configured to, responsive to a control code, output a first value and a second value. A first current mirror is configured to generate a first current that is proportional to the first value, while a second current mirror is configured to generate a second current that is proportional to the second value. A first FET pair is also provided. The first FET pair comprises a first FET, with a first gate terminal receiving a clock signal, and a second FET having second gate terminal receiving an inverted clock signal such that the source terminals of the first FET and the second FET are electrically connected and connect to the first current mirror to receive the first current. A second FET pair is also provided. The second FET pair comprises a third FET, with a third gate terminal receiving the inverted clock signal, and a fourth FET a having fourth gate terminal receiving the clock signal such that the source terminals of the third FET and the fourth FET are electrically connected and connect to the second current mirror to receive the second current. A first output terminal is configured to output a phase adjusted clock signal as compared to the clock signal. The first output terminal is connected to a first drain terminal of the first FET and a third drain terminal of the third FET. A second output terminal, configured to output an inverted version of the phase adjusted clock signal, connected to a second drain terminal of the second FET and a fourth drain terminal of the fourth FET.

In one configuration the first value is different than the second value. In addition, the first value may be inversely proportional to the second value.

In one embodiment, the control code controls the amount of phase adjustment in the phase adjusted clock signal. It is contemplated that the phase interpolator may further comprise a degeneration resistor connected to each source terminal. As a benefit over the prior art, the disclosed phase interpolator requires only an input signal and an inverted input signal. It is contemplated that the first current mirror has a first mirror ratio and the second current mirror has a second mirror ratio and the first mirror ratio is different than the second mirror ratio.

Also disclosed is a method for adjusting phase of an input signal comprising receiving the input signal, an inverted input signal and a control code indicating an amount of phase adjustments to apply to the input signal. Then, generating a first current based on the control code and generating a second current based on the control code such that the first current is not equal to the second current. The first current is provided to a first FET pair such that flow of the first current through FETs that form the first FET pair is controlled by the input signal and the inverted input signal. The second current is provided to the second FET pair such that flow of the second current through FETs that form the second FET pair is controlled by the input signal and the inverted input signal. This method then forms a phase adjusted output signal from a first current of the first FET pair and a second FET current of the second FET pair. Likewise, this method forms an inverted version of the phase adjusted output signal from a second FET current of the first FET pair and a second FET current of the second FET pair.

In one embodiment, the control code is a digital value and the control code is converted to a first analog value and a second analog value by one or more digital to analog converters. It is contemplated that generating the first current based on the control code may be performed by a first current mirror and generating the second current based on the control code may be performed by a second current mirror.

The amount of phase adjustment is also determined by mirror ratios of the first current mirror and the second current mirror. This method of operation may further comprise converting the input signal and the inverted input signal from a square wave signal to a more rounded sine wave type signal suitable for mixing signal using one or more degeneration resistors and capacitors. In one embodiment, the method may further comprise processing the phase adjusted output signal with an inverter to form a square wave signal from the phase adjusted output signal. The input signal may be a clock signal.

Also disclosed is a phase interpolator for adjusting phase of an input signal. In one embodiment the phase interpolator comprises a first current source configured to generate a first current and a second current source configured to generate a second current. In this configuration, the first current is different than the second current and the difference between the first current and the second current is based on or determined by a control value. A switching block is configured to receive the first current, the second current, the input signal, and an inverted input signal. The FETs and, selectively perform switching, controlled by the input signal and inverted input signal, to create and output at least an output signal which is a delayed version of the input signal such that an amount of delay in the output signal is controlled by the difference between the first current and the second current.

In one embodiment, the first current source comprises a first current mirror and the second current source comprises a second current mirror. The control value may be processed by a DAC to generate a first signal and a second signal, such that the first signal controls a magnitude of the first current and the second signal controls a magnitude of the second current. In one configuration, the switching block comprises two cross connected FET pairs with gate terminals configured to receive the input signal or inverted input signal. In one embodiment, the phase interpolator further comprises one or more degeneration resistors configured to decrease a rate of change of the input signal and inverted input signal. The input signal may be a clock signal.

Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 5A illustrates plots of the input clock signal, the inverted clockb signal, and the resulting output clock signal which is phase adjusted.

FIG. 5B illustrates plots of the input clock signal 504, the inverted clockb signal 508, and the resulting output clock signal 540 which is phase adjusted to one of the shown phase adjustments or delays.

DETAILED DESCRIPTION

The hybrid phase interpolator disclosed herein achieves the fine delay resolution and maintains the tight variation over process, voltage, and temperature changes that is achievable from a traditional phase interpolator. As an improvement over the prior art, the hybrid phase interpolator is able to provide high resolution timing variation using only a differential clock thereby overcoming the requirement in the prior art phase interpolators for quadrature clocks.

Figure 1:
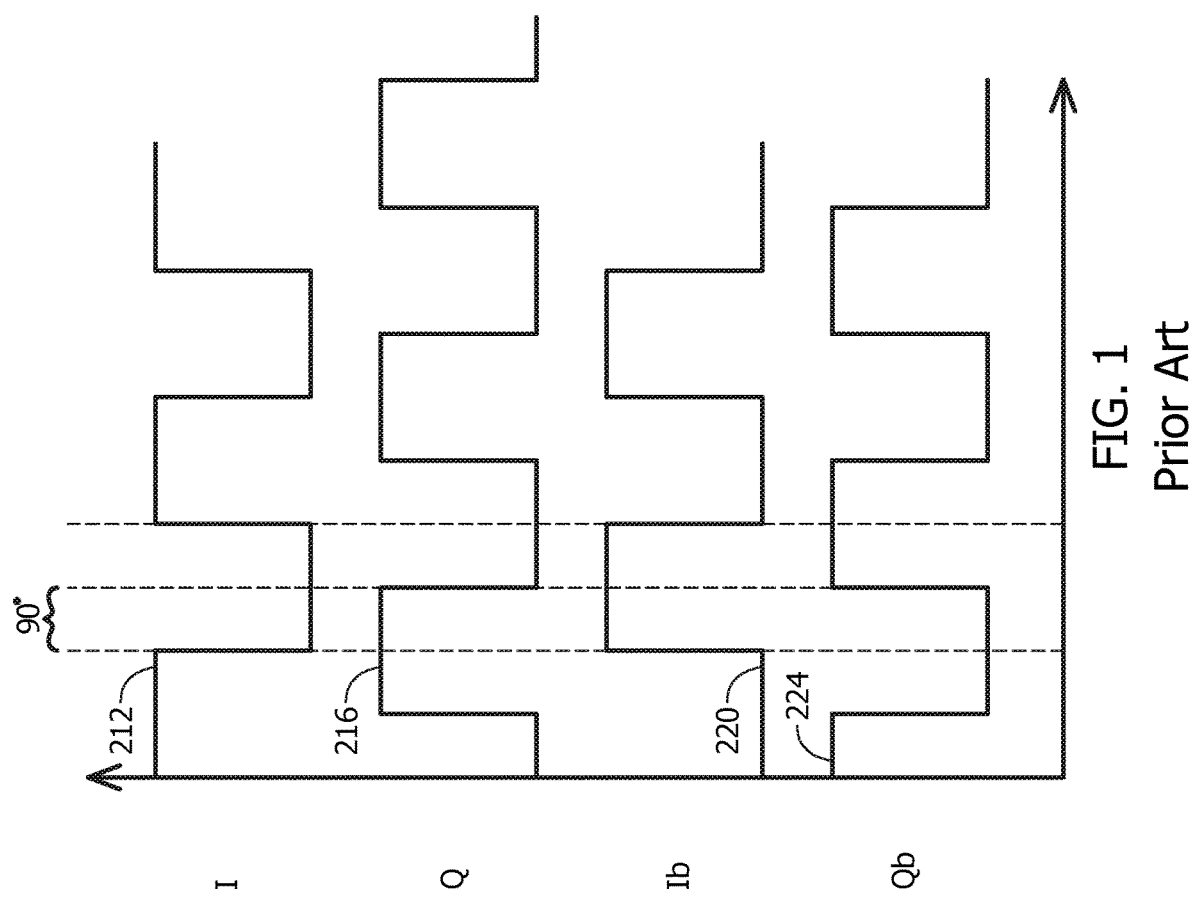
FIG. 1 illustrates quadrature clock signal plots.
Figure 2:
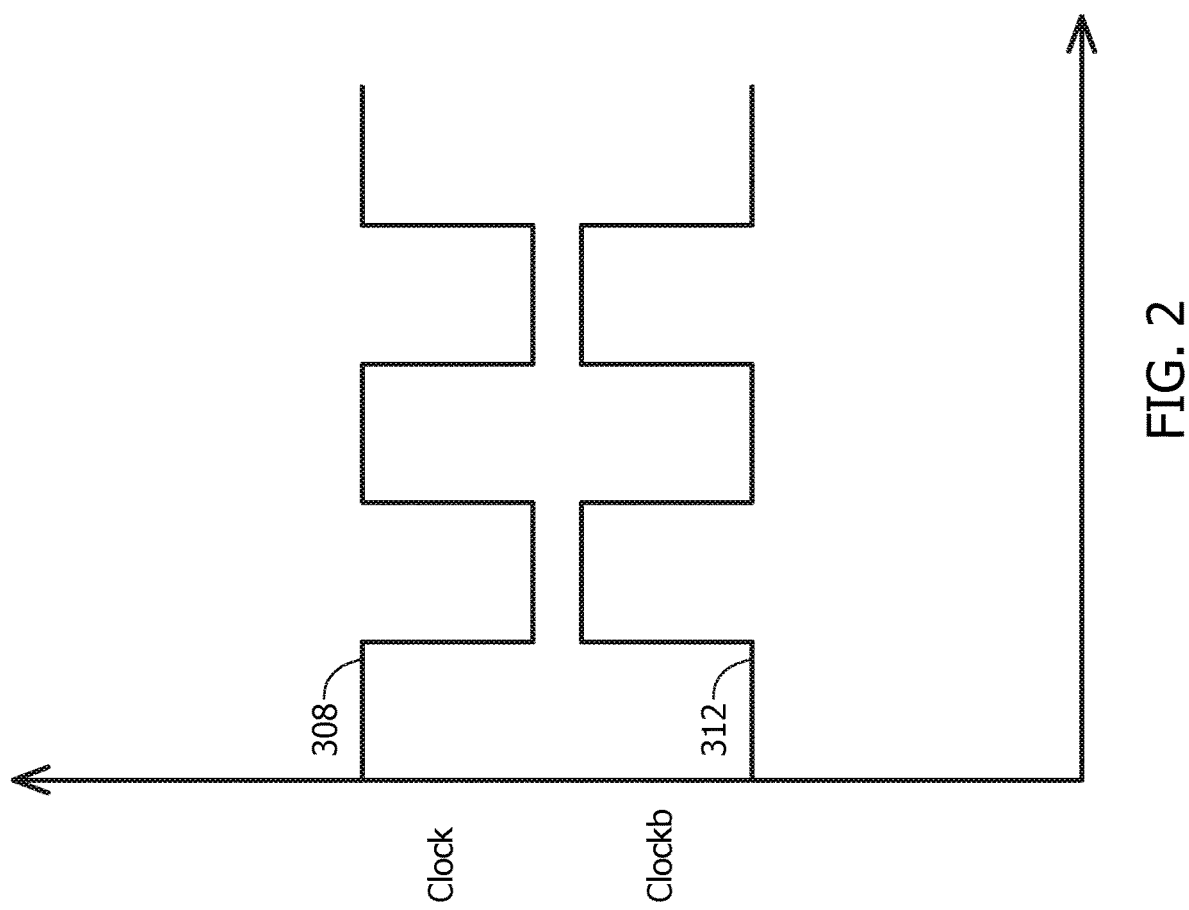
FIG. 2 illustrates differential clock signal plots.

FIG. 2 illustrates exemplary differential clock signal plots, which is a clock signal plot and an inverted clock signal plot. As shown in FIG. 2, the differential clocks comprise a clock signal 308 and a clock bar (clockb) signal 312 which is an inverted version of the clock signal 308. When the clock signal 308 is high, the clock bar signal 312 is low, and when the clock signal 308 is low, the clock bar signal 312 is high.

Figure 3:
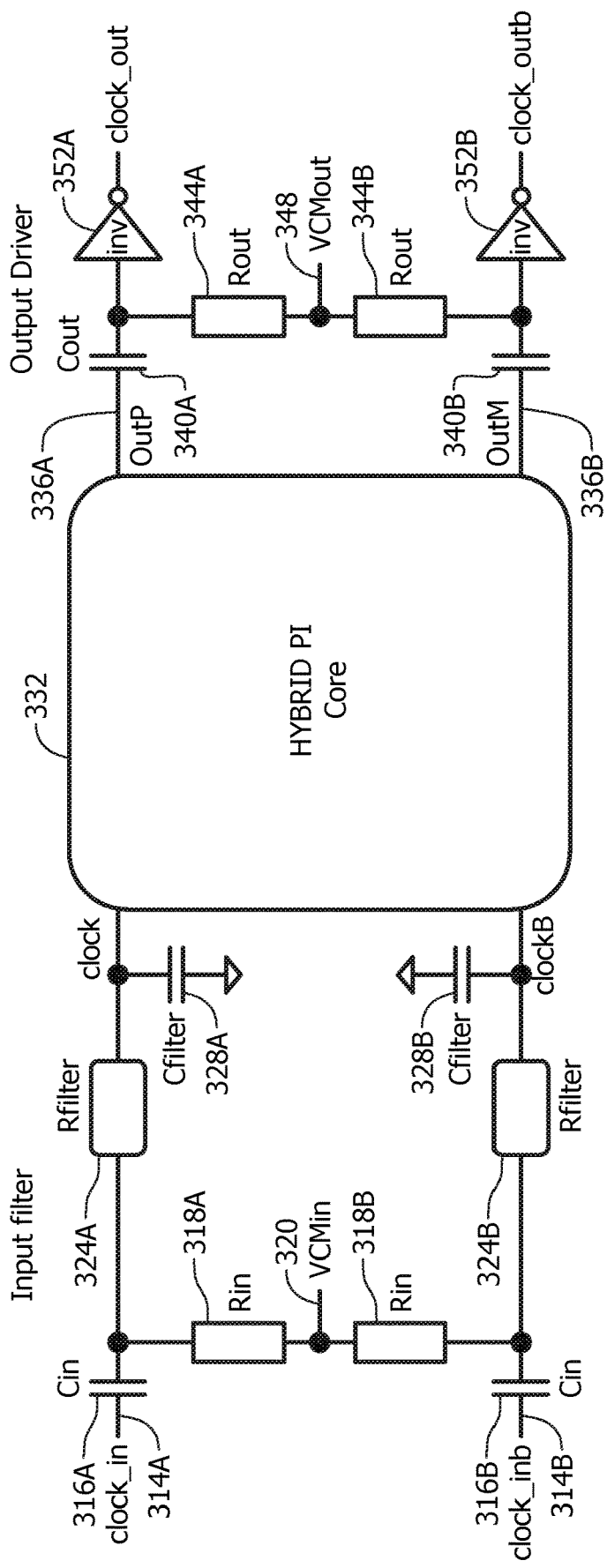
FIG. 3 illustrates an example operating environment for a hybrid phase interpolator as described herein.

FIG. 3 illustrates an example operating environment for a hybrid phase interpolator as described herein. This is but one example embodiment and as such, other embodiments are contemplated. In this implementation an input clock and clockb (inverted clock) are provided to inputs 314A, 314B. Although described for purposes of discussion as a clock signal, it is contemplated that any type signal may be processed. The input 314A is AC coupled through the input capacitor (Cin) 316A while input 314B is AC coupled through the input capacitor (Cin) 316B to facilitate the optimum biasing for the input differential NFET pairs (MN0-1 and MN2-3) shown in FIG. 4. An optimum bias voltage is set by the common-mode input voltage VCMin 320. This voltage could be set to keep the differential NFET pairs (discussed below) in a linear region of operation, which is also aided by the degeneration resistors (Rdegen) shown in FIG. 4. Input resistors 318A, 318B are provided for impedance matching and to properly set the bias. Maintaining the NFET pairs in the linear region of operation and use of degeneration resistors provides the benefit of avoiding sharp square waveforms on the outputs which are less desirable or not suitable for mixing/combining clock inputs. Alternatively, the FETs may be bipolar devices such as NPN devices, and could use other processes, such as but not limited to GaAs.

The input capacitors 316A, 316B also connect to low-pass filtering resistors 324A, 324B as shown for further low-pass filtering of the input clock signals clock, clockb. Capacitors Cfilter 328A, 328B, facilitates the rounding or slowing down of the edges of the high frequency input clock, clockb. This filtering, which is done on the input clocks, facilitates mixing of the input clock signals. A hybrid phase interpolator core 332 receives the clock and clockb signals after filtering. The hybrid phase interpolator core 332 is discussed in detail in FIG. 4.

The phase interpolator core 332 has two outputs 336A, 336B which provide the phase adjusted clock signals to output capacitors 340A, 340B, which block any unwanted DC components from the phase interpolator core 332 and AC couple the outputs to resistors 344A, 344B and to inverters 352A, 352B. The outputs may be referred to as Outp and Outm which are the phase adjusted version of the input clock signals clock, clockb. The structure to the right of the phase interpolator core 332 may be referred to as an AC coupled driver. The inverters 352A, 352B may be CMOS inverters configured to amplify the core output and drive out a full CMOS differential signal (clock_out & clock_outb). The inverters 352A, 352B convert the output signal to a square wave signal. The optimum bias for these inverters is set by the output common mode voltage (VCMout) 348. In one configuration, the optimum bias voltage 348 is established at half the supply voltage which is typically the optimum high-gain trigger point for the inverter. The bias voltage at node 348 may also be set by an inverter in a replica-bias type configuration where the output of an inverter is fed back to its input, reaching an equilibrium point, which is the optimum trigger voltage for the inverter. A comparator or amplifier could also be used in place of the inverter(s) 352A, 352B. The driver outputs 356A, 356B provide a phase adjusted clock signal. The phase adjusted clock signal may be provided to a receiver or transmitter, or any other circuit element that benefits from or requires a phase adjusted signal. In addition, signals other than a clock signal may be phase adjusted using the method and apparatus described herein.

Figure 4:
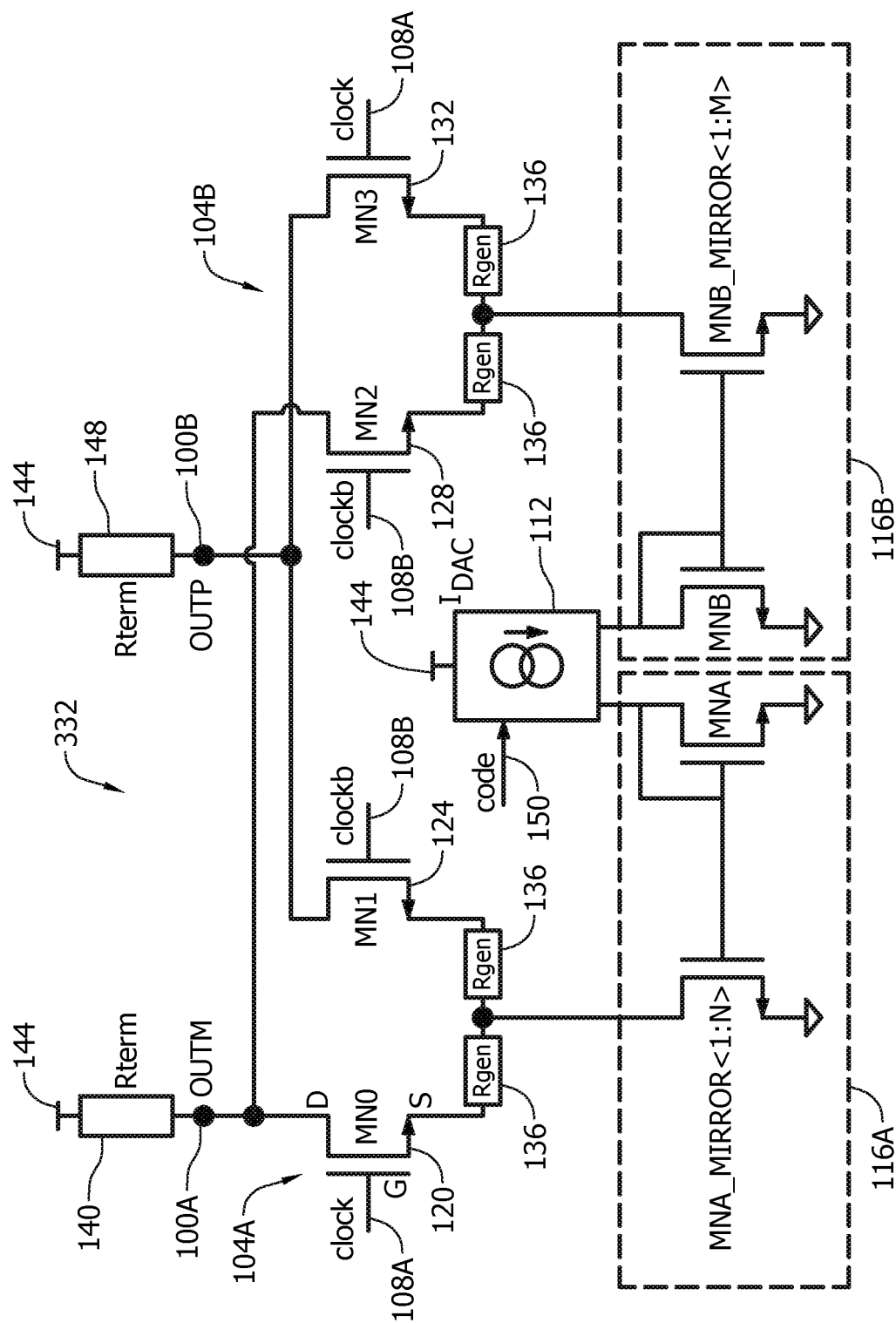
FIG. 4 is a block diagram of an exemplary circuit implementation of the phase-interpolator core shown in FIG. 3.

FIG. 4 is a block diagram of an exemplary circuit implementation of the phase-interpolator core shown in FIG. 3. This is a CMOS implementation, however, other embodiments may utilize other type technology. In this example embodiment, two differential input NFET pairs (MN0-1 and MN2-3) 104A, 104B are driven differentially by the differential clock 108A, 108B, with the pair MN2-3 being driven with opposite polarity. NFET pair MN0-1 is formed by FETs 120, 124. The first FET pair 104A comprises a FET MN0 120 and a second FET MN1 124 which have the source terminals connected as shown through degeneration resistors 136. The second FET pair 104B comprises a FET MN2 128, and a second FET MN3 132 which have the source terminals connected as shown through degeneration resistors 136. The degeneration resistors 136 function to slow the signal transition (from high to low or from low to high), i.e. change the slope of the signal at the point of transition.

The drain terminal of FET 120 connects to output node 100A which corresponds to output 336A in FIG. 3. The output node 100A also connects to a termination resistor 140, which in turn connects to a supply voltage node 144. The output node 100A also connects to a drain terminal of FET 128.

The drain terminal of FET 132 connects to output node 100B which corresponds to output 336B in FIG. 3. The output node 100B also connects to a termination resistor 148, which in turn connects to a supply voltage node 144. The output node 100B also connects to a drain terminal of FET 124 as shown.

Below the FET pairs are two current mirrors 116A, 116B. The current mirrors 116A, 116B may be fixed ratio or programmable such that programmable current mirrors have mirror ratios or amplification that can be changed. Current mirrors are known in the art and as such are not described in detail. Providing an input to the current mirrors 116A, 116B is one or more digital to analog converters (DAC) 112. The output current of the DAC 112, to the current mirrors 116A, 116B, is set by a DAC code 150. The DAC code 150 may be generated by a DSP core, processor, controller, or any other source. By way of example and not limitation, the DAC code may be a 4 to 8 bit code or value which can change to control an amount of delay or phase adjustment introduced into the output signal. The current mirror 116A connects to the source terminal of FET 120 and FET 124 between the two degeneration resistors 136. Similarly, the current mirror 116B connects to the source terminal of FET 128 and FET 132 between the two degeneration resistors 136.

The amount of current flowing through the FET pairs 104A, 104B is controlled by a control code 150 provided to a DAC 112. The DAC 112 has two different outputs which provide different values to current mirrors 116A, 116B. In one embodiment, the DAC 112 is a 5- or 6-bit DAC, such that in the case of a 5-bit DAC, there are 32 possible values. The DAC outputs are differential or inverse such that for a 5-bit DAC, if one DAC output is 3, the other DAC output is 28, or if one DAC output is 8, then the other DAC code is 23. In the embodiment shown in FIG. 4, the DAC 112 thus provides a different magnitude signal (such as input current) to each current mirror 116A, 116B and this in turn controls an amount of current that is provided to each FET pair 104A, 104B.

The output of the differential current is mirrored to the differential pairs 104A, 104B through the programmable NFET current mirrors (devices MNA_MIRROR and MNB_MIRROR) 116A, 116B. In this embodiment, the current mirrors 116A, 116B have different mirror ratios resulting in a different current being provided to each NFET pair 104A, 104B. In one embodiment, each mirror 116A, 116B has four possible mirror ratios (1, 2, 3, 4) and one mirror is set to 1:1 and other set to 1:3. It is important to note that the DAC output (codes) and mirror ratios for each mirror 116 (MNA and MNB) should not be the same. If the DAC output (codes) and mirror ratios were the same, then the output differential clock (OUTP-OUTM) will have zero amplitude as the differential pairs 104A, 104B will have equal weighting and their outputs will effectively cancel each other.

The system shown in FIG. 4 provides a time or phase shift on the differential output clock (clock_out & clock_outb) which is dictated by the differential DAC current flowing in the current mirror devices (MNA & MNB) 116A, 116B. The phase shift (delay, phase adjustment) can be considered a change in the propagation delay from the differential input clock clock in & clock inb 108A, 108B (FIG. 3) to the differential output clock OutM 100A and OutN 100B (FIG. 3). As the DAC current is varied by changes in the DAC code 150, the effective switching speed of the differential pair 104A, 104B changes which in turn changes the delay introduced in the output signals.

The following is one example method of operation. When FET MN2 128 is being turned on by a rising edge on clockb, FET MN0 120 is being turned off by a falling edge on clock (due to the clockb signal being an inverted version of the clock signal). Both of these actions contribute to the voltage change on OUTM output 110A. The major contributor of the actual timing of output clock OutM 100A will depend on whether there is more current flowing in FET 120 MN0 or in FET MN2 128. It is therefore possible to weight the transition (voltage) on OUTM 100A transition in favor of clock or clockb signal. This change in current weighting results in a change to the output propagation delay.

During this example transition, FET MN3 132 is turning off by the falling edge on clock input 108A and FET MN1 124 is turning on by the rising edge on clockb input 108B. Because the current flowing in FET MN3 132 is greater than the current flowing in FET MN3 124, due to the different mirroring ratio, FET MN3 132 will transition (turn on or conduct) faster (sooner) than FET MN1 124. This results in a weighting factor in favor of the falling edge of clock over the rising edge of clockb. The weighting factor refers to the mirror ratio providing the coarse weighting in favor of clock or clockb. In summary because of the differential nature of the circuit, there is a weighting factor in favor of the rising edge of clockb and in favor of the falling edge of clock, and this weighting factor introduces the change in clock delay or phase into the output signals. Changing the DAC code will skew this weighting factor to be more or less in favor of these transitions. The DAC code change may be considered as a fine skew adjustment of the weighting factor (resulting in a fine propagation delay adjustment and phase shift on the output clock).

In addition, the MNA_mirror 116A and MNB_mirror 116B settings provide for a large coarse adjustment, assigning a major weighting factor to these edges over the opposite edges (falling edge on clockb and rising edge on clock). As a result, changing the mirror ratio can re-assign or adjust this coarse weighting. An example of such a coarse weighting change would be to change the MNB_mirror ratio from 4-to-1 and the MN_mirror from 1-to-4. This would result in effectively inverting the clock output as the falling edge on clockb and rising edge on clock gain in weighting/transition speed favor. This change in the switching speed, together with the core output amplitude change, results in a propagation delay change on the differential output clocks of the output driver as compared to the differential input clocks.

The mirroring of the two DAC codes is one factor that distinguishes this phase-interpolator from a more traditional version and permits the allocation of more current to one of the differential pairs. In addition, prior art phase interpolators require quadrature clocks, while this innovation only requires a differential clock pair, (i.e., two clock signals). As a result, this innovation reduces complexity and power consumption as compared to prior art designs.

FIG. 5A illustrates plots of the input clock signal, the inverted clockb signal, and the resulting output clock signal which is phase adjusted. The top two plots 504, 508 represent the clock signal and the inverted output clock. The bottom plot 520 represent the clock output of the phase interpolator. The inverted output clock (output clockb) from the phase interpolator is not shown but would be an inverted version of the output clock signal 520. As shown in FIG. 5A, the signal plot 520 is the clock signal which may have been delayed or phase shifted various amounts based on the DAC code and/or the mirror ratio such that the mirror ratio provides large step resolution adjustment, and the DAC code provides small step resolution adjustment.

For example, a first DAC code will result in a small phase shift which shifts the rising edge 512A and the falling edge 512B of the clock a small amount. A second larger DAC code will shift the clock a greater amount as shown by rising edge 516A and falling edge 516B of the clock. Other DAC codes will establish other amounts of phase shift. A greater DAC resolution allows for greater resolution or precision in the output clock phase shift.

In these exemplary signal plots, the mirror MNA (first mirror) weighting has been set to a higher factor than that of the mirror MNB (second mirror) weighting. The output clock delay is set by the DAC code and the delay range and step size is set by the DAC resolution.

It is possible to change or swap the mirror weightings. This new phase-interpolator design also offers the option of inverting the output clock. This can be accomplished by swapping the mirror weightings between MNA_mirror 116A and MNB_mirror 116B.

FIG. 5B illustrates plots of the input clock signal 504, the inverted clockb signal 508, and the resulting output clock signal 540 which is phase adjusted to one of the shown phase adjustments or delays. The top two plots 504, 508 represent the clock signal and the inverted output clock as shown in FIG. 5A. The bottom plot 540 represents the clock output of the phase interpolator with current mirror weightings (ratios) swapped. The inverted output clock (output clockb) from the phase interpolator is not shown but would be an inverted version of the output clock signal 540.

As shown in FIG. 5B, the signal plot 540 is inverted as compared to plot 504 (FIG. 5A) due to the swapping the mirror weightings between MNA_mirror 116A and MNB-_mirror 116B. As a result, the mirror MNB 116B has a higher weighting (DAC current value and/or mirror ratio) than mirror MNA 116A. Consequently, the output clock signal is delayed, or phase shifted various amounts based on the DAC code and/or the mirror ratio but is now inverted as compared to clock 504. For example, a first DAC code will result in a small phase shift which shifts or delays the falling edge 542A and the rising edge 542B of the clock. A second larger DAC code will shift the clock input a greater amount as shown by falling edge 546A and rising edge 556B of the clock. Other DAC does will establish other amounts of phase shift.

Figure 6:
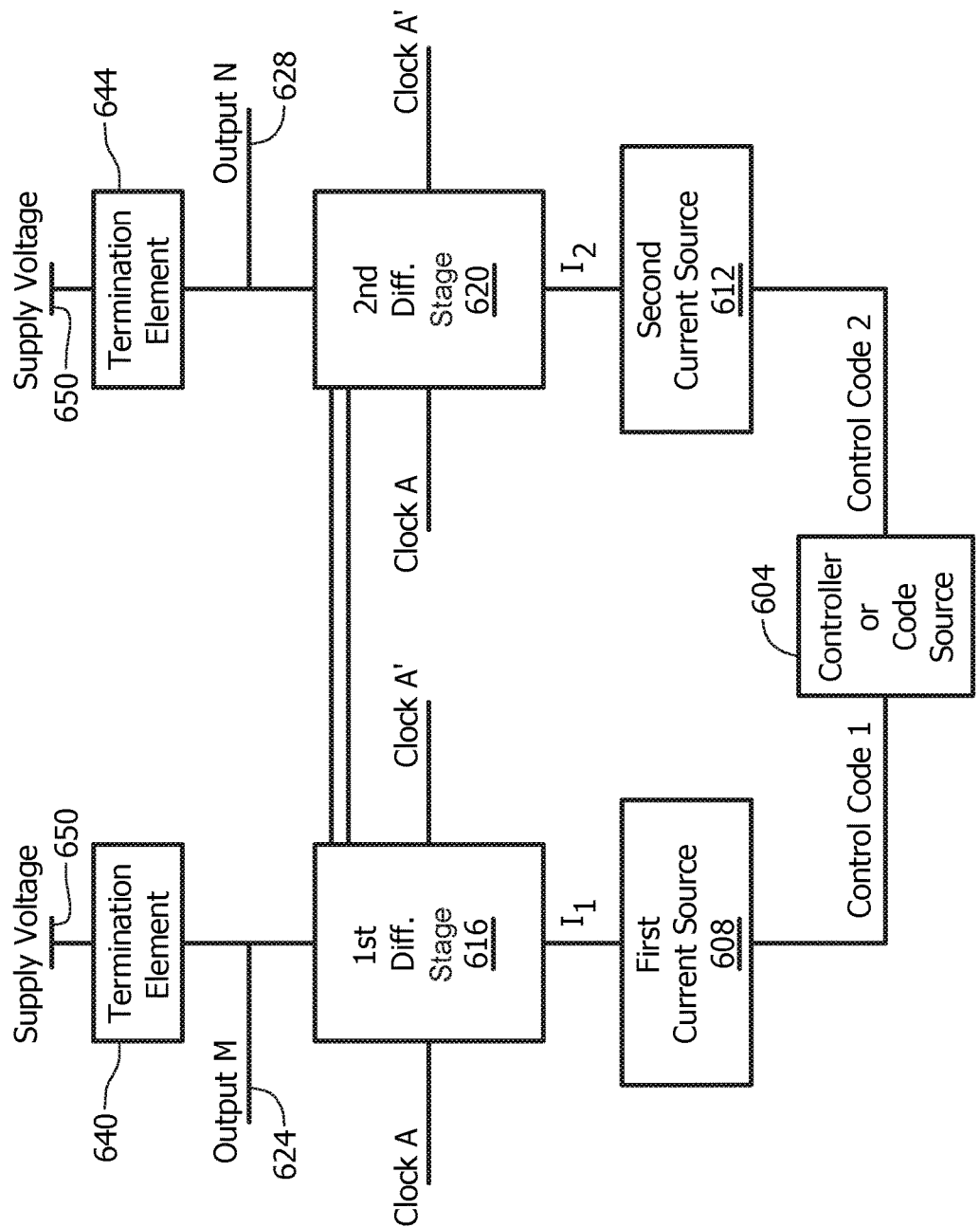
FIG. 6 illustrates a block diagram of an example embodiment of the innovation.

FIG. 6 illustrates a block diagram of an example embodiment of the innovation. This is but one possible alternative embodiment and is presented in a more generalized format than that shown in FIG. 4. In this example embodiment, a controller or code source 604 provides instructions or a first value to a first current source 608 and a second value to the second current source 612. The controller or code source 604 may be any element configured to provide the code(s) that controls the amount of phase delay. Examples include but are not limited to memory, user interface, feedback loop, other circuit element, digital signal processor engine. The current sources 608, 612 may be any type of configuration of current source configured to generate or conduct a current defined by the control code from the controller or code source 604.

The first current source 608 connects to a first differential stage 616 and the second current source 612 connects to a second differential stage 620. The differential stage 620 may also be a switching module or one or more switches which are controlled by the clock and clock b signals. The first differential stage 616 and the second differential stage 620 are connected as shown. The first differential stage 616 receives the clock signal and an inverted version of the clock signal. The second differential stage 616 receives the clock signal and an inverted version of the clock signal. Each differential stage 616, 620, being controlled by the clock and inverted clock, generates a phase adjusted output clock signal (and inverted clock signal) on outputs 624, 628 that generally matches the clock signal and inverted clock signal, but is delayed based on the control code 1 value and control code 2 value, which are different. The different control code 1 value and control code 2 value vary the rate or timing at which transistors in the first differential stage 616 and the second differential stage 620 turn on and off. Termination elements 640, 644 connect to the output nodes 624, 628 and to a supply voltage 650 as shown.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A phase interpolator comprising:
   digital to analog converter configured to, responsive to a control code, output a first value and a second value, wherein the first value is different than the second value;
   a first current mirror configured to generate a first current that is proportional to the first value;
   a second current mirror configured to generate a second current that is proportional to the second value;
   a first FET pair comprising a first FET, with a first gate terminal receiving a clock signal, and a second FET having second gate terminal receiving an inverted clock signal such that the source terminals of the first FET and the second FET are electrically connected and connect to the first current mirror to receive the first current;
   a second FET pair comprising a third FET, with a third gate terminal receiving the inverted clock signal, and a fourth FET having fourth gate terminal receiving the clock signal such that the source terminals of the third FET and the fourth FET are electrically connected and connect to the second current mirror to receive the second current, wherein the clock signal and the inverted clock signal are the only clock signals provide to gates terminals of FET pairs in the phase interpolator;

a first output terminal, configured to output a phase adjusted clock signal as compared to the clock signal, connected to a first drain terminal of the first FET and a third drain terminal of the third FET;

a second output terminal, configured to output an inverted version of the phase adjusted clock signal, connected to a second drain terminal of the second FET and a fourth drain terminal of the fourth FET.

2. The phase interpolator of claim 1 wherein the first value is different than the second value.

3. The phase interpolator of claim 2 wherein the first value is inversely proportional to the second value.

4. The phase interpolator of claim 1 wherein the control code controls the amount of phase adjustment in the phase adjusted clock signal.

5. The phase interpolator of claim 1 further comprising a degeneration resistor connected to each source terminal.

6. The phase interpolator of claim 1 wherein the phase interpolator requires only the clock signal and the inverted clock signal.

7. The phase interpolator of claim 1 wherein the first current mirror has a first mirror ratio and the second current mirror has a second mirror ratio and the first mirror ratio is different than the second mirror ratio.

8. A method for adjusting phase of an input signal with a phase interpolator comprising:

receiving the input signal, an inverted input signal and a control code indicating an amount of phase adjustment to apply to the input signal;

generating a first current based on the control code and generating a second current based on the control code such that the first current is not equal to the second current;

providing the first current to a first FET pair such that flow of the first current through FETs that form the first FET pair is controlled by the input signal and the inverted input signal;

providing the second current to second FET pair such that flow of the second current through FETs that form the second FET pair is controlled by the input signal and the inverted input signal, wherein the first FET pair and the second FET pair are the only FET pairs in the phase interpolator and the method for adjusting phase in the phase interpolator requires only the input signal and the inverted input signal to be provided to the first FET pair and the second FET pair;

forming a phase adjusted output signal from a first current of the first FET pair and a second FET current of the second FET pair; and forming an inverted version of the phase adjusted output signal from a second FET current of the first FET pair and a second FET current of the second FET pair.

9. The method of claim 8 wherein the control code is a digital value and the control code is converted to a first analog value and a second analog value by one or more digital to analog converters.

10. The method of claim 8 wherein generating the first current based on the control code is performed by a first current mirror and generating the second current based on the control code is performed by a second current mirror.

11. The method of claim 8 wherein the amount of phase adjustment is also determined by mirror ratios of the first current mirror and the second current mirror.

12. The method of claim 8 further comprising converting the input signal and the inverted input signal from a square wave signal to a rounded sine wave type signal using one or more degeneration resistors and capacitors.

13. The method of claim 8 further comprising processing the phase adjusted output signal with an inverter to form a square wave signal from the phase adjusted output signal.

14. The method of claim 8 wherein the input signal is a clock signal.

15. A phase interpolator for adjusting phase of an input signal comprising:

a first current source configured to generate a first current;

a second current source configured to generate a second current, such that the first current is different than the second current and the difference between the first current and the second current is based on a control value;

a switching block configured to receive the first current, the second current, the input signal, and an inverted input signal and, selectively perform switching, controlled by the input signal and inverted input signal, to create and output at least an output signal which is a delayed version of the input signal such that an amount of delay in the output signal is controlled by the difference between the first current and the second current, wherein the switching, in the switching block of the phase interpolator is controlled by only the input signal and the inverted input signal.

16. The phase interpolator of claim 15 wherein the first current source comprises a first current mirror and the second current source comprises a second current mirror.

17. The phase interpolator of claim 15 wherein the control value is processed by a DAC to generate a first signal and a second signal, such that the first signal controls a magnitude of the first current and the second signal controls a magnitude of the second current.

18. The phase interpolator of claim 15 wherein the switching block comprises two cross connected FET pairs with gate terminals configured to receive one of the input signal and inverted input signal.

19. The phase interpolator of claim 15 further comprising one or more degeneration resistors configured to decrease a rate of change of the input signal and inverted input signal.

20. The phase interpolator of claim 15 wherein the input signal is a clock signal.

* * * * *